(12) United States Patent
Moran et al.

(10) Patent No.: US 9,406,347 B2
(45) Date of Patent: Aug. 2, 2016

(54) SEMICONDUCTOR WAFER AND METHOD OF FABRICATING AN IC DIE

(71) Applicants: Robert F. Moran, Largs (GB); Derek Beattie, Giffnock (GB); Mark Maiolani, Glasgow (GB)

(72) Inventors: Robert F. Moran, Largs (GB); Derek Beattie, Giffnock (GB); Mark Maiolani, Glasgow (GB)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/574,597

(22) Filed: Dec. 18, 2014

(65) Prior Publication Data

US 2016/0180891 A1 Jun. 23, 2016

(51) Int. Cl.
*H01L 23/544* (2006.01)
*G11C 5/02* (2006.01)
*G11C 5/06* (2006.01)
*G11C 8/10* (2006.01)
*G11C 7/10* (2006.01)
*H01L 21/82* (2006.01)
*H01L 27/02* (2006.01)
*H01L 23/528* (2006.01)

(52) U.S. Cl.
CPC *G11C 5/025* (2013.01); *G11C 5/06* (2013.01); *G11C 7/1048* (2013.01); *G11C 8/10* (2013.01); *H01L 21/82* (2013.01); *H01L 23/528* (2013.01); *H01L 27/0207* (2013.01)

(58) Field of Classification Search
CPC ............ H01L 21/8239; H01L 27/1023; H01L 27/1024
See application file for complete search history.

(56) References Cited

U.S. PATENT DOCUMENTS

| | | | |
|---|---|---|---|
| 6,119,675 | A | 9/2000 | Akram et al. |
| 6,174,788 | B1 | 1/2001 | Balamurugan |
| 7,224,042 | B1 | 5/2007 | McCollum |
| 7,718,512 | B2 | 5/2010 | McCollum |
| 8,674,483 | B2 | 3/2014 | Sutardja |
| 2008/0017971 | A1* | 1/2008 | Hollis ................ H01L 23/5386 257/698 |

* cited by examiner

*Primary Examiner* — Elias M Ullah

(57) ABSTRACT

There is provided a semiconductor wafer comprising a plurality of replicated IC modules. Each replicated IC module is capable of forming an individual IC die. The semiconductor wafer further comprises inter-module cross-wafer electrical connections, and the replicated IC modules are further arranged to be cut into IC dies comprising multiple replicated IC modules.

There is further provided a method of fabricating an IC die. The method comprises fabricating such a semiconductor wafer, determining a required configuration of replicated IC modules, identifying inter-module boundaries along which to cut the semiconductor wafer to achieve the required configuration of replicated IC modules, and cutting the semiconductor wafer along the identified inter-module boundaries to produce at least one IC die comprising the required configuration of replicated IC modules.

20 Claims, 6 Drawing Sheets

US 9,406,347 B2

SEMICONDUCTOR WAFER AND METHOD OF FABRICATING AN IC DIE

FIELD OF THE INVENTION

This invention relates to a semiconductor wafer and a method of fabricating an integrated circuit die.

BACKGROUND OF THE INVENTION

In the field of integrated circuits, memory configurations may vary across a product family. For example, in an automotive instrument cluster family of products, high-end applications may require, say 8 MB of RAM (random access memory), while lower-end applications may require, say 1 MB of RAM. Conventionally, two approaches to providing different memory configurations across a product range have been used.

A first conventional approach involves 'phantoming' down the memory configuration from the high-end application to the lower-end applications, whereby unrequired memory is disabled for the lower-end applications. In this manner, only a single silicon mask set is created, but a lower gross margin is achievable for the lower-end products.

A second conventional approach is to create separate silicon mask sets for each required memory configuration. In this manner, an optimal, cost efficient memory configuration is achieved for the lower-end products. However, as the cost of new silicon mask sets is becoming an increasingly higher part of the overall product cost, the need to create new silicon mask sets for all each individual product within a product range is becoming increasingly less desirable.

SUMMARY OF THE INVENTION

The present invention provides a semiconductor wafer, set of wafer masks, an integrated circuit die, an integrated circuit device and a method of fabricating an integrated circuit die as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

resource address is modified as it is forwarded through the array of replicated IC modules 110.

Figure 5:
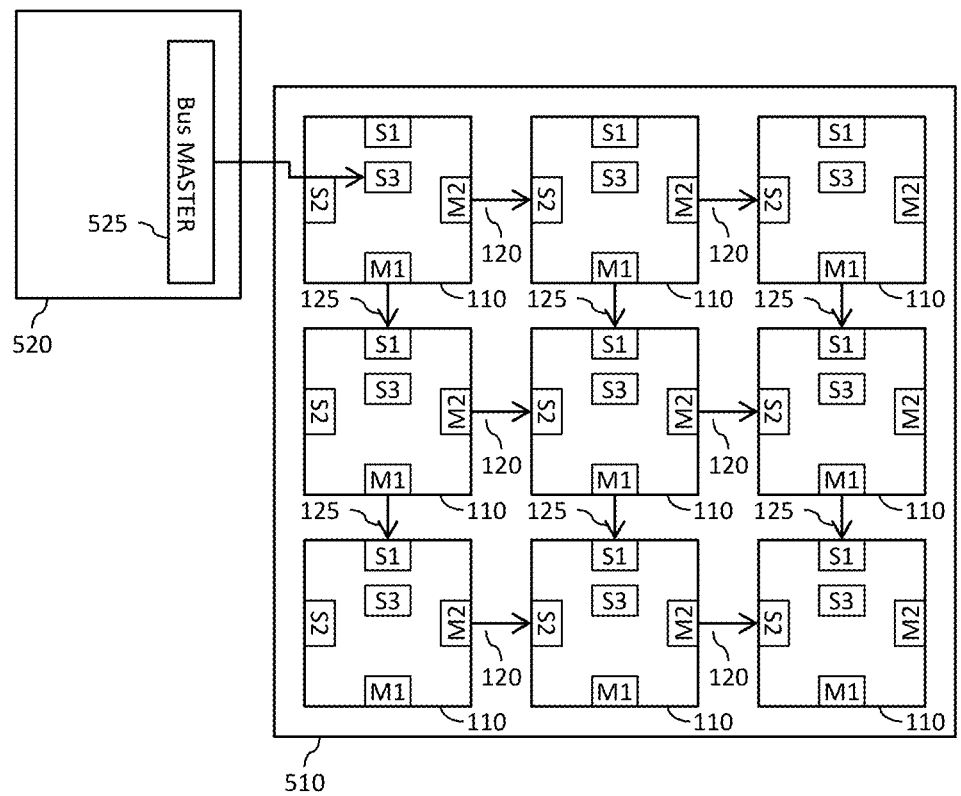

FIG. 5 schematically illustrates an example of an addressing scheme and decoding mechanism for multiple replicated IC modules arranged in a two-dimensional array structure.

Figure 6:
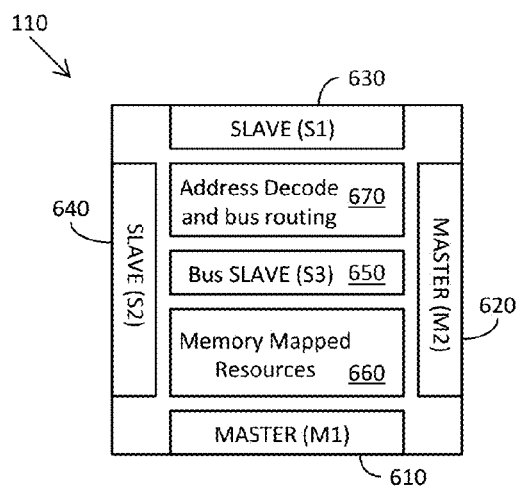

FIG. 6 illustrates a simplified block diagram of an example of a replicated IC module within the two-dimensional array structure of FIG. 5.

Figure 7:
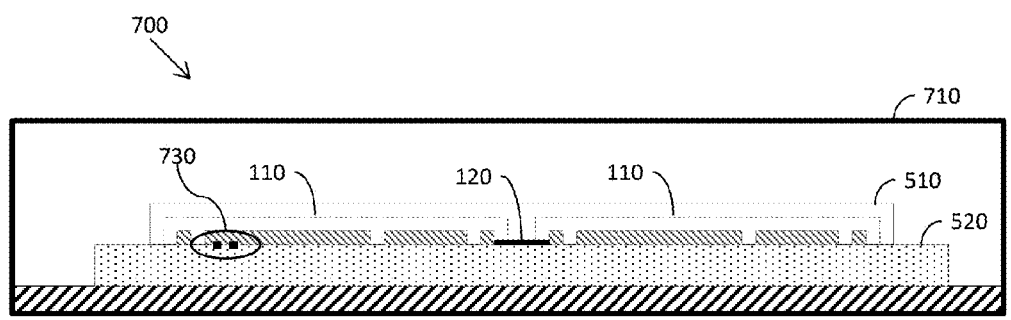

FIG. 7 schematically illustrates a cross-sectional view of an example of an IC device.

Figure 8:
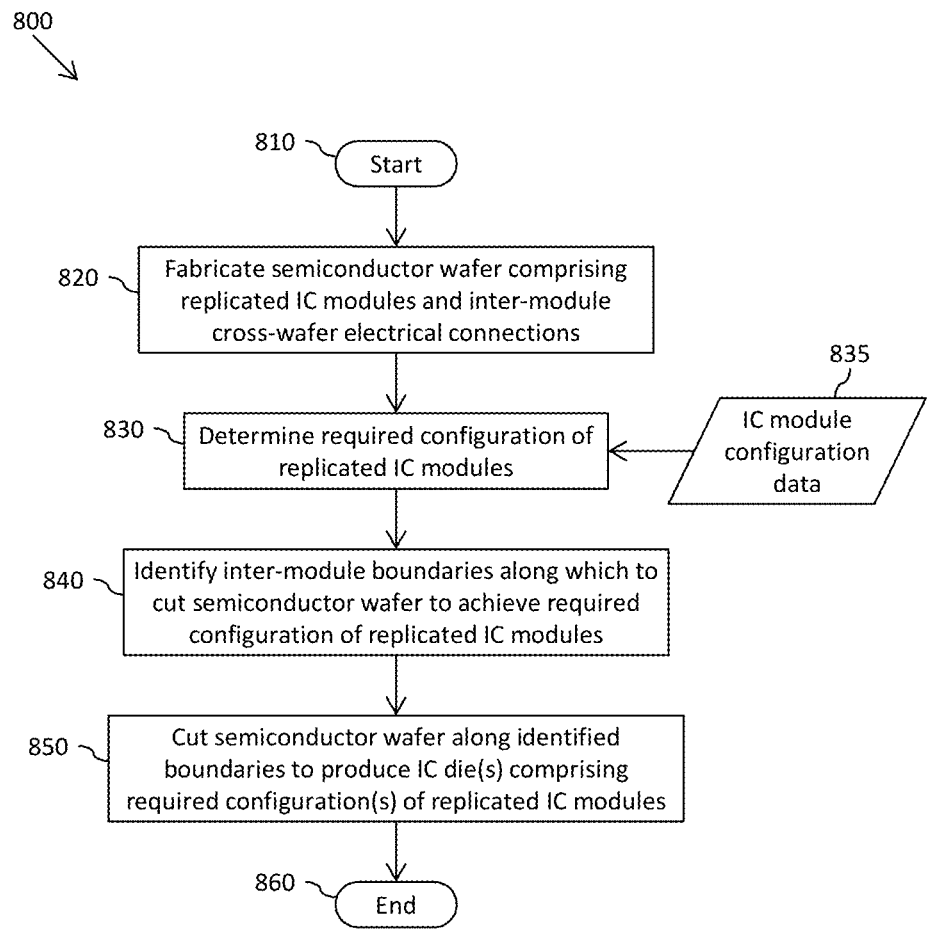

FIG. 8 illustrates a simplified flowchart of an example of a method of fabricating an IC die.

DETAILED DESCRIPTION OF THE PREFERRED EMBODIMENTS

The present invention will now be described with reference to the accompanying drawings. However, it will be appreciated that the present invention is not limited to the specific examples herein described and as illustrated in the accompanying drawings.

Furthermore, because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

In accordance with some examples of a first aspect of the present invention, there is provided a semiconductor wafer comprising a plurality of replicated integrated circuit (IC) modules, each replicated IC module capable of forming an individual IC die. The semiconductor wafer further comprises inter-module cross-wafer electrical connections and the replicated IC modules are further arranged to be cut into IC dies comprising multiple replicated IC modules.

In this manner, and as described in greater detail below, IC dies comprising different configurations of the replicated IC modules may be created from the semiconductor wafer based on where the semiconductor wafer is cut (sawn). For example, the semiconductor wafer may be cut into IC dies comprising just a single replicated IC module, since each replicated IC module is capable of forming an individual IC die. Conversely, the semiconductor wafer may be cut into IC dies comprising multiple replicated IC modules, with the inter-module cross-wafer electrical connections enabling the replicated IC modules within an IC die to communicate with one another and provide combined functionality. Advantageously, such a semiconductor wafer is capable of providing IC dies for both high-end applications requiring functionality from multiple replicated IC modules, as well as for low-end applications requiring functionality from fewer (e.g. just one) replicated IC modules without having to resort to 'phantoming' the high-end application IC die configurations, and without having to create separate silicon mask sets for the differing application requirements.

Figure 1:
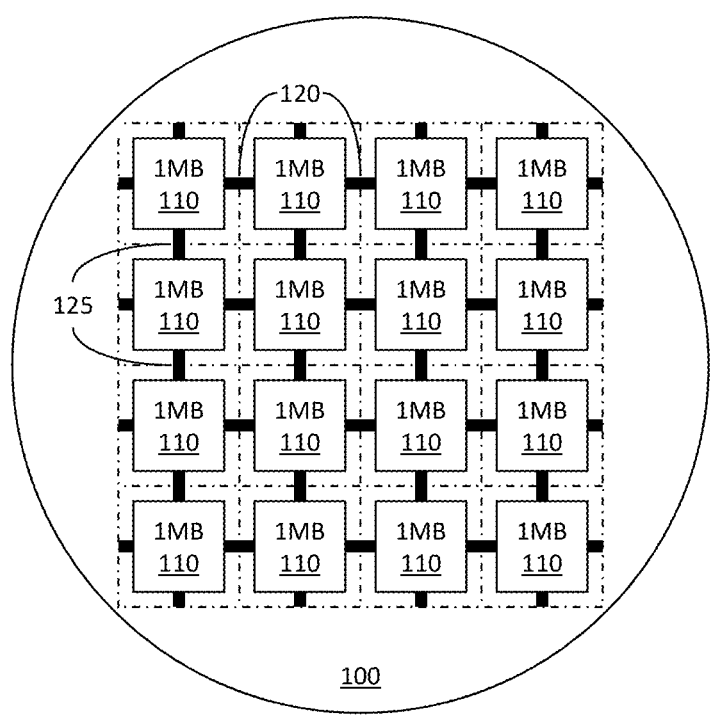
FIG. 1 schematically illustrates a simplified plan view of an example of a semiconductor wafer.

Referring now to FIG. 1, there is schematically illustrated a simplified plan view of an example of a semiconductor wafer 100. The semiconductor wafer 100 comprises a plurality of replicated integrated circuit (IC) modules 110. Each replicated IC module 110 is capable of forming an individual IC die, and it is contemplated that the replicated IC modules 110 may be substantially identical. The semiconductor wafer 100 further comprises inter-module cross-wafer electrical connections, such as the inter-module cross-wafer electrical connections 120, 125 indicated in FIG. 1, enabling the replicated IC modules 110 to further be capable of forming IC dies comprising multiple replicated IC modules 110 as described in greater detail below.

In some examples, the semiconductor wafer 100 may comprise scribe lines separating the replicated IC modules 110, such as illustrated by the broken lines in FIG. 1, with IC dies being singulated by cutting along appropriate scribe lines, and across the inter-module cross-wafer electrical connections 120, 125 crossing the scribe lines being cut along.

In the illustrated example, each replicated IC module 110 comprises a memory module comprising one or more memory elements providing 1 MByte of memory, for example Random Access Memory (RAM). However, it will be appreciated that the present invention is not limited to memory modules, and it is contemplated that the invention may equally be implemented in relation to any type of IC module capable of functioning alone or as part of a multi-module implementation, such as, for example, replicated logic circuits, processing blocks, etc.

Each replicated IC module 110 comprises one or more inter-module cross-wafer electrical connection(s) 120, 125 spanning one or more scribe and edge seal boundary(ies) of the replicated IC module 110, and operably coupling the replicated IC module 110 to least one further replicated IC module 110. In the example illustrated in FIG. 1, the replicated IC modules 110 are arranged into a two dimensional array layout within the semiconductor wafer 100, the two dimensional array comprising 4×4 replicated IC modules 110. Accordingly, in the illustrated example the semiconductor wafer 100 comprises sixteen replicated IC modules 110. However, it will be appreciated that other examples the semiconductor wafer may comprise substantially any number of replicated IC modules, depending on the size and density of the IC modules within the semiconductor wafer, and may be arranged in any suitable manner within the semiconductor wafer. In particular, it is contemplated that the invention is not limited to the semiconductor wafer comprising replicated IC modules arranged in a symmetric (e.g. n×n) two dimensional array layout, and in some examples it is contemplated that the replicated modules may be arranged into an n×m array layout, where n is greater than or equal to 1. Furthermore, although sixteen replicated IC modules are illustrated in FIG. 1, it will be appreciated that this number of replicated IC modules is not intended to be limiting, and that in alternative examples of the present invention the semiconductor wafer may comprise fewer or more replicated IC modules, and in some examples may comprise significantly more replicated IC modules, for example numbering in the hundreds or even thousands.

Figure 2:
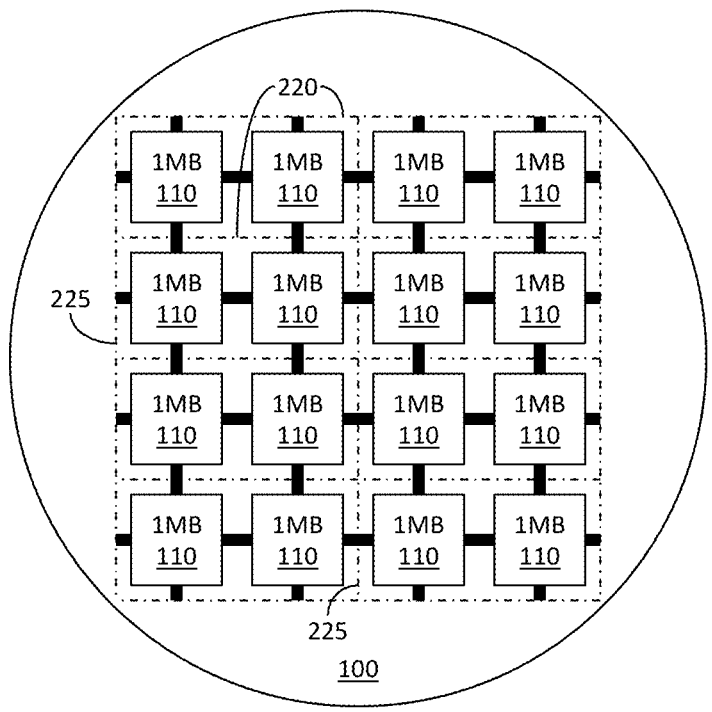
FIGS. 2 and 3 illustrated examples of scribe lines along which the semiconductor wafer of FIG. 1 may be cut to create IC dies comprising different configurations of replicated IC modules.
Figure 3:
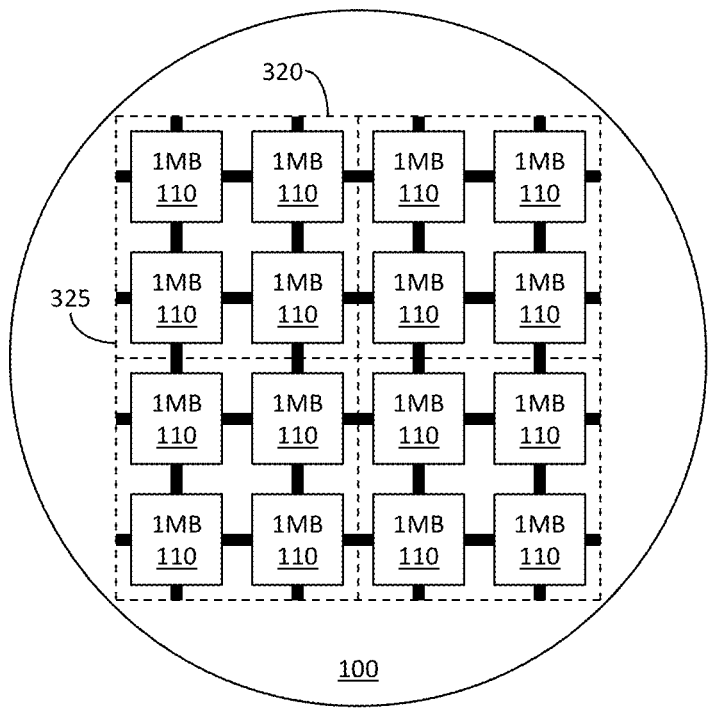

In the example illustrated in FIG. 1, inter-module cross-wafer electrical connections 120, 125 are provided between each pair of adjacent replicated IC modules 110 within the array layout. In this manner, IC dies comprising different configurations of the replicated IC modules 110 may be created from the semiconductor wafer 100 based on where the semiconductor wafer 100 is cut (sawn). For example, FIG. 2 illustrates scribe lines 220, 225 along which the semiconductor wafer 100 may be cut to create IC dies comprising two replicated IC modules 110. In this manner, eight IC dies, each comprising 2 Mbytes of memory, may be created from the semiconductor wafer 100. FIG. 3 illustrates alternative scribe lines 320, 325 along which the semiconductor wafer 100 may be cut to create IC dies comprising four replicated IC modules 110. In this manner, four IC dies, each comprising four Mbytes of memory, may be created from the semiconductor wafer 100. It will be appreciated that IC dies comprising still further configurations may be created from the semiconductor wafer 100. For example, a single IC die comprising all sixteen replicated IC modules 110 may be created, comprising 16 Mbytes of memory. Alternatively, sixteen IC dies may be created, each comprising just a single replicated IC module providing 1 Mbyte of memory. It is further contemplated that the semiconductor wafer 110 need not be cut into IC dies of a uniform size and configuration. For example, a mixture of IC dies may be created from the semiconductor wafer 100, such as, say, four IC dies each comprising two of the replicated IC modules 110 (such as those illustrated in FIG. 2) and two IC dies each comprising four of the replicated IC modules 110 (such as those illustrated in FIG. 3).

In the illustrated examples, each replicated IC module 110 comprises four inter-module cross-wafer electrical connections 120, 125 spanning scribe and edge seal boundaries on each side of the replicated IC module 110. In this manner, and as illustrated in FIGS. 1 to 3, each replicated IC module 110 is operably coupled to adjacent replicated IC modules 110 on all four sides thereof within the two-dimensional array structure. As also illustrated in FIGS. 1 to 3, those replicated IC modules 110 located at the periphery of the two-dimensional array structure may also be provided within cross-wafer electrical connections spanning their scribe and edge seal boundaries facing outward of the array structure (for example due to the same silicon mask being used for replicated IC modules 110 located at the periphery of the array structure as at the centre of the array structure), even though they do not connect to another replicated IC module 110.

Each inter-module cross-wafer electrical connection 120, 125 is arranged to convey electrical signals between two or more replicated IC modules 110. The individual inter-module cross-wafer electrical connections 120, 125 are not limited to a single electrical connection, and may comprise any required number of electrical connection for implementing any required functionality and/or inter-module communication. For example, as previously identified, the replicated IC modules 110 in the illustrated example comprise memory modules. As such, the inter-module cross-wafer electrical connections 120, 125 may be arranged to provide cross-wafer memory expansion interfaces capable of providing a means of requesting access to memory mapped resources between replicated IC modules 110. One example of such a memory expansion interface that may be provided by way of an inter-module cross-wafer electrical connection 120, 125 comprises an external bus interface with address, data and control signals.

Figure 4:
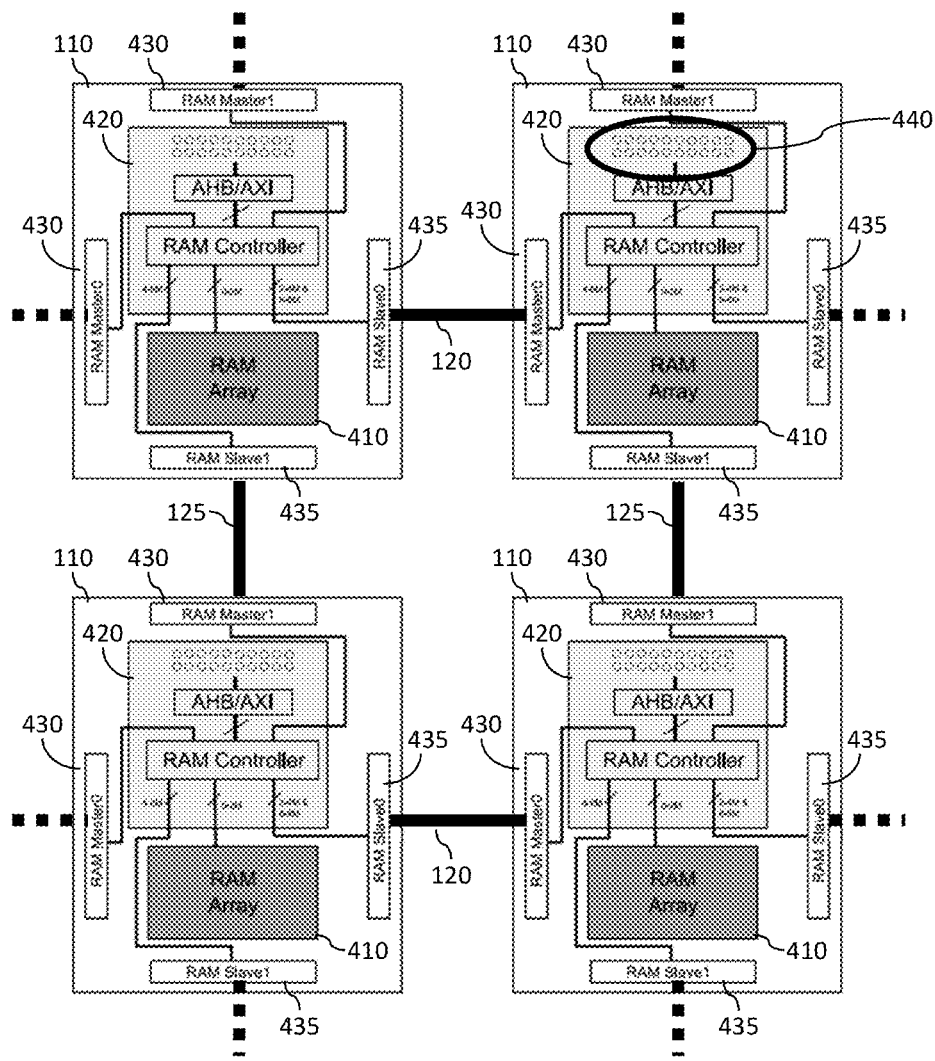
FIG. 4 illustrates a simplified block diagram of an example of replicated IC modules of FIGS. 1 to 3 in greater detail.

FIG. 4 illustrates a simplified block diagram of an example of the replicated IC modules 110 of FIGS. 1 to 3 in greater detail. Each replicated IC module 110 comprises functional circuitry, which in the illustrated example comprises an array of memory (RAM) 410 and a memory controller 420. Each replicated IC module 110 further comprises a memory expansion interface port on each side thereof, and to which inter-module cross-wafer electrical connections 120, 125 are operably coupled to provide cross-wafer memory expansion interfaces between adjacent replicated IC modules 110.

In some examples, it is contemplated that inter-module cross-wafer electrical connections may be provided on first sides of each replicated IC module along a first orientation and a second orientation, for example a 'top' side (first side of 'y-axis' orientation) and 'left-hand' side (a first side of 'x-axis' orientation), that are arranged to 'push' accesses to memory mapped resources within adjacent replicated IC modules. Conversely, in such examples it is contemplated that inter-module cross-wafer electrical connections may be provided on second sides of each replicated IC module along the first and second orientations, for example a 'bottom' side (second side of 'y-axis' orientation) and 'right-hand' side (a second side of 'x-axis' orientation), that are arranged to receive accesses to memory mapped resources from adjacent replicated IC modules.

For example, and as illustrated in FIG. 4, the top and left-hand sides (from the perspective of the illustrated plan view) of each replicated IC module 110 comprise master memory expansion interface ports 430, whilst the bottom and right-hand sides (from the perspective of the illustrated plan view) of each replicated IC module 110 comprise slave memory expansion interface ports 435.

In addition to the inter-module cross-wafer electrical connections 120, 125, it is contemplated that each replicated IC module 110 may further comprise one or more external interface connection. For example, such an external interface connection may comprise a System-in-Package (SiP) interface for connecting the replicated IC module 110 to one or more co-packaged IC dies using, say, bonding wires, copper pillars or solder bumps (in a stacked die arrangement), etc. In the example illustrated in FIG. 4, the replicated IC modules 110 comprise an SiP interface port, such as the SiP interface port circled at 440 for one of the replicated IC modules 110 illustrated in FIG. 4, the SiP interface ports 440 comprising, for example, an array of contacts with which each of the replicated IC modules is capable of establishing an inter-die connection (e.g. by way of copper pillars or solder bumps) with an external device, for example such as located within a co-packed IC die on which the replicated IC module 110 is stacked.

Advantageously, because inter-module cross-wafer electrical connections 120, 125 are provided between the replicated IC modules 110, only one replicated IC module 110 is required to establish a physical connection with, say, a system-on-chip (SoC) or other external device (not shown) with which the replicated IC modules 110 are required to communicate. All other replicated IC modules 110 within the IC die comprising the replicated IC modules 110 are able to communicate with the SoC (or other external device) via the one replicated IC module 110 physically connected thereto by way of the inter-module cross-wafer electrical connections 120, 125. This reduces the number of interface connections the external device is required to provide to communicate with the replicated IC modules 110, and thus can remove restrictions on the physical size of the external device, especially when used in a SiP configuration.

In order to enable an external device such as an SoC to access the resources within a replicated IC module 110 not directly connected thereto, a means of addressing the individual replicated IC modules 110 is required. For example, each replicated IC module 110 within an IC die may be configured, for example upon first use to respond to a unique address range. In this manner, an SoC is able to access the resources within individual replicated IC module 110 by using the unique address range for that replicated IC module 110. In this manner, a semiconductor wafer of replicated IC modules 110 may be cut and packaged into arbitrarily sized arrays to flexibly meet application needs.

FIG. 5 schematically illustrates an example of an addressing and decoding mechanism for multiple replicated IC modules 110 arranged in a two-dimensional array structure. In the example illustrated in FIG. 5, a first IC die comprises the two-dimensional array of replicated IC modules 110. FIG. 6 illustrates a simplified block diagram of an example of a replicated IC module 110 within the two-dimensional array of FIG. 5. Each replicated IC module 110 comprises a bus interface port on each of its four sides. Two of the bus interfaces (M1 and M2) 610, 620 on each replicated IC module 110 comprise master bus ports arranged to generate resource access requests, whilst the other two bus interfaces (S1 and S2) 630, 640 on each replicated IC module 110 comprise slave ports arranged to respond to resource access requests. Inter-module cross-wafer electrical connections 120, 125 operably couple adjacent master and slave ports on neighbouring replicated IC modules 110, as illustrated in FIG. 5. Each replicated IC module 110 further comprises an external interface connection (S3) 650 comprising a bus slave connection arranged to be connected to an external bus master. In the example illustrated in FIG. 5, only the top left replicated IC module 110 (from the perspective of the illustrated plan view) is connected to an external bus master 525 located on a second IC die 520, for example by way of bonding wires, copper pillars or some other die to die interconnect technology.

In the illustrated example, each replicated IC module 110 within the in the replicated IC module array has been configured with a unique address range. The external master 525 is able to access any resource in the replicated IC module array using the unique address ranges of the replicated IC modules 110 in the array. Upon receipt of a resource request on the external interface connection (S3) 650 or a slave bus port (S1 and S2) 630, 640, a replicated IC module 110 may be arranged to determine whether the target address of the received resource request is within its own unique address range. If the received resource request is within its own unique address range, the replicated IC module 110 may service the received resource request, and provide any required response back via the external interface connection (S3) 650 or the slave bus port (S1 and S2) 630, 640 on which the resource request was received. Conversely, if the received resource request is not within its own unique address range, the replicated IC module 110 may forward the resource request on one or both of its master bus ports (M1 and M2) 610, 620.

Such an addressing scheme may be implemented within an address decoding and routing component 670 (FIG. 6) of each replicated IC module 110. Such an address decoding and bus routing component 670 may be provided within the RAM controller 420 of each of the replicated IC memory modules 110 illustrated in FIG. 4.

In some examples, it is contemplated that electrical, mechanical and/or logical protection for signals transmitted over inter-module cross-wafer connections may be provided to protect against, for example, short circuits or other undesired electrical or logic effects that could occur due to the 'cutting' across of the cross-wafer interconnect.

As previously mentioned, the present invention is not limited to replicated IC memory modules, and in some examples it is contemplated that the replicated IC modules may comprise alternative types of functionality capable of being memory mapped, including memory (e.g. RAM, non-volatile memory, etc.), logic circuits, peripheral devices, processing blocks, etc.

In some examples, it is contemplated that different metal routing layers could be used for providing the inter-module cross-wafer electrical connections for different configurations of replicated IC modules, whereby only the cross-wafer electrical connections that are valid for required configuration of replicated IC modules are implemented. For example, one metal routing layer could be used to provide the inter-module cross-wafer electrical connections for configurations of two replicated IC modules (such as the 'groups' illustrated in FIG. 2), whilst a different metal routing layer could be used to provide the inter-module cross-wafer electrical connections for configurations of, say, four replicated IC modules (such as the 'groups' illustrated in FIG. 3). Creating separate metal routing layer masks for the different replicated IC modules is relatively inexpensive, and would provide the advantage of clearly defined die boundaries for different configurations of replicated IC modules, and avoid the need for cutting across cross-wafer electrical connections.

As will be appreciated by a skilled person, the present invention enables the flexible fabrication of IC dies comprising variable replicated IC module configurations that may be connected to external devices, such as an SoC using SiP technology, via just a single external interface connection between the IC die comprising the replicated IC module(s) and the IC die comprising the external device, whilst enabling access to resources provided by all of the repeatable IC modules.

FIG. 7 schematically illustrates a cross-sectional view of an IC device 700 comprising the IC die 510 cut from the semiconductor wafer 100 located within an IC package 710. In the example illustrated in FIG. 7, the IC die 510 comprises two replicated IC modules 110 operably coupled together by an inter-module cross-wafer electrical connection 120. The IC die 510 is mounted on a second IC die 520, for example comprising an SoC, and an external interface connection of one of the replicated IC modules 110 is connected to, for example, an external bus master located on the second IC die 520, for example by way of copper pillars circled at 730. Thus, in the example illustrated in FIG. 7, the IC die 510 comprising the replicated IC modules 110 is co-located within the same IC device package 710 as the second IC die 520 to which the replicated IC modules 110 are connected. However, in some alternative examples it is contemplated that the IC die 510 comprising the replicated IC modules 110 may alternatively be located within a separate IC device package to the second IC die 520, whereby an external interface connection of one (or more) of the replicated IC modules 110 is connected to the second IC die 520 via package pins and printed circuit board (PCB) routing.

Referring now to FIG. 8, there is illustrated a simplified flowchart 800 of an example of a method of fabricating an IC die. The method starts at 810, and moves on to 820 where a semiconductor wafer comprising replicated IC modules and inter-module cross-wafer electrical connections is fabricated, such as the semiconductor wafer 110 illustrated in FIGS. 1 to 3. Next, at 830, the method comprises determining a required configuration of replicated IC modules, for example based on predefined IC module configuration data 835. Inter-module boundaries along which to cut the semiconductor wafer to achieve the required configuration of replicated IC modules are then identified, at 840. The semiconductor wafer is then cut along the identified inter-module boundaries to produce at least one IC die comprising the required configuration of replicated IC modules, at 850, and the method ends at 860.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

For example, the semiconductor wafer 100 described herein may comprise a substrate made from any semiconductor material or combinations of materials, such as gallium arsenide, silicon germanium, silicon-on-insulator (SOI), silicon, monocrystalline silicon, the like, and combinations of the above.

Moreover, the terms 'front,' 'back,' 'top,' 'bottom,' 'over,' 'under' and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms 'assert' or 'set' and 'negate' (or 'de-assert' or 'clear') are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A semiconductor wafer comprising a plurality of replicated integrated circuit, IC, modules, each replicated IC module capable of forming an individual IC die;
   wherein the semiconductor wafer further comprises inter-module cross-wafer electrical connections and the replicated IC modules are further arranged to be cut into IC dies comprising multiple replicated IC modules.

2. The semiconductor wafer of claim 1, wherein the replicated IC modules are arranged into a two dimensional array layout within the semiconductor wafer of n×m replicated IC modules, where n is greater than or equal to 1, and wherein n is a first number of replicated IC modules in a first direction on the semiconductor wafer, and m is a second number of replicated IC modules in a second direction on the semiconductor wafer, wherein the first and second directions are orthogonal to each other.

3. The semiconductor wafer of claim 2, wherein the semiconductor wafer comprises at least one inter-module cross-wafer electrical connection between each pair of adjacent replicated IC modules within the array layout.

4. The semiconductor wafer of claim 2, wherein each replicated IC module comprises an address decoding and routing component arranged to implement a unique address range addressing scheme.

5. The semiconductor wafer of claim 1, wherein each replicated IC module comprises at least one inter-module cross-wafer electrical connection spanning at least one scribe and edge seal boundary of the replicated IC module, and operably coupling said replicated IC module to at least one further replicated IC module.

6. The semiconductor wafer of claim 5, wherein each replicated IC module is operably coupled to adjacent replicated IC modules on all four sides thereof by inter-module cross-wafer electrical connections.

7. The semiconductor wafer of claim 6, wherein:
   inter-module cross-wafer electrical connections provided on first sides of each replicated IC module along a first orientation and a second orientation are arranged to push accesses to memory mapped resources within adjacent replicated IC modules; and
   inter-module cross-wafer electrical connections provided on second sides of each replicated IC module along the first orientation and the second orientation are arranged to receive accesses to memory mapped resources from adjacent replicated IC modules.

8. The semiconductor wafer of claim 1, wherein the inter-module cross-wafer electrical connections comprise memory expansion interfaces.

9. The semiconductor wafer of claim 1, wherein at least one of electrical, mechanical and logical protection is provided for the inter-module cross-wafer electrical connections.

10. The semiconductor wafer of claim 1, wherein each replicated IC module comprises at least one external interface connection.

11. The semiconductor wafer of claim 10, wherein the at least one external interface connection comprises a System-In-Packaging, SiP, interface connection.

12. The semiconductor wafer of claim 10, wherein the at least one external interface connection comprises a bus slave connection arranged to be connected to an external bus master.

13. The semiconductor wafer of claim 1, wherein the replicated IC modules comprise IC resources capable of being memory mapped.

14. The semiconductor wafer of claim 13, wherein the replicated IC modules comprise at least one of:
   memory modules;
   logic circuits; and
   processing blocks.

15. A set of wafer masks for fabricating a semiconductor wafer according to claim 1.

16. An integrated circuit die from a semiconductor wafer according to claim 1.

17. An integrated circuit device comprising at least one die from a semiconductor wafer according to claim 1 implemented within a single integrated circuit package.

18. A method of fabricating an integrated circuit, IC, die, the method comprising:
   fabricating a semiconductor wafer including: plurality of replicated integrated circuit, IC, modules, each replicated IC module capable of forming an individual IC die and including edge seal boundaries, the replicated IC modules arranged to be cut into IC dies comprising multiple replicated IC modules, and inter-module cross-wafer electrical connections and the replicated IC modules are further arranged to be cut into IC dies comprising multiple replicated IC modules;
   determining a required configuration of replicated IC modules;
   identifying inter-module boundaries along which to cut the semiconductor wafer to achieve the required configuration of replicated IC modules; and
   cutting the semiconductor wafer along the identified inter-module boundaries to produce at least one IC die comprising the required configuration of replicated IC modules.

19. The method of claim 18, wherein each replicated IC module comprises at least one inter-module cross-wafer electrical connection spanning at least one scribe and edge seal boundary of the replicated IC module, and operably coupling said replicated IC module to at least one further replicated IC module.

20. A semiconductor wafer comprising:
   a plurality of replicated integrated circuit, IC, modules including a first replicated IC module and a second replicated IC module, each replicated IC module capable of forming an individual IC die and including edge seal boundaries, the replicated IC modules arranged to be cut into IC dies comprising multiple replicated IC modules;

a plurality of scribe line separating the replicated IC modules; and an inter-module cross-wafer electrical connection spanning a first scribe line of the scribe lines and an edge seal boundary of the first replicated IC module and the edge seal boundary of a second replicated IC module to operably couple the first and second replicated IC modules.

\* \* \* \* \*